(12) United States Patent
Marumoto et al.

(10) Patent No.: US 7,486,797 B2
(45) Date of Patent: Feb. 3, 2009

(54) AUDIO CORRECTING APPARATUS

(75) Inventors: Toru Marumoto, Iwaki (JP); Nozomu Saito, Iwaki (JP)

(73) Assignee: Alpine Electronics, Inc., Tokyo (JP)

( * ) Notice: Subject to any disclaimer, the term of this patent is extended or adjusted under 35 U.S.C. 154(b) by 796 days.

(21) Appl. No.: 10/862,820

(22) Filed: Jun. 7, 2004

(65) Prior Publication Data

US 2005/0013443 A1 Jan. 20, 2005

(30) Foreign Application Priority Data

Jun. 16, 2003 (JP) ............................. 2003-170346

(51) Int. Cl.
*H03G 3/20* (2006.01)

(52) U.S. Cl. ..................... 381/57; 381/94.3; 381/94.7

(58) Field of Classification Search ............ 381/56–57, 381/86, 94.1–94.9, 71.1, 71.11, 93, 122, 381/104–105, 107; 379/406.01, 406.05, 379/406.08

See application file for complete search history.

(56) References Cited

U.S. PATENT DOCUMENTS

| | | | | |
|---|---|---|---|---|
| 5,077,799 A | * | 12/1991 | Cotton | 381/57 |
| 5,369,449 A | * | 11/1994 | Yukitake et al. | 348/699 |
| 5,590,241 A | | 12/1996 | Park et al. | |
| 5,778,077 A | * | 7/1998 | Davidson | 381/57 |
| 6,173,058 B1 | * | 1/2001 | Takada | 381/66 |
| 6,584,201 B1 | * | 6/2003 | Konstantinou et al. | 381/57 |
| 6,655,212 B2 | * | 12/2003 | Ohta | 73/586 |
| 6,700,979 B1 | * | 3/2004 | Washiya | 379/406.09 |
| 6,778,601 B2 | * | 8/2004 | Ise et al. | 375/232 |
| 6,807,278 B1 | * | 10/2004 | Mercs et al. | 381/94.1 |
| 6,847,723 B1 | * | 1/2005 | Kiuchi et al. | 381/94.7 |
| 6,901,141 B1 | * | 5/2005 | Sakata et al. | 379/406.01 |
| 6,944,303 B2 | * | 9/2005 | Akiho | 381/71.14 |
| 7,003,099 B1 | * | 2/2006 | Zhang et al. | 379/406.03 |
| 7,110,951 B1 | * | 9/2006 | Lemelson et al. | 704/270 |

FOREIGN PATENT DOCUMENTS

| | | |
|---|---|---|
| JP | 05-168087 | 7/1993 |
| JP | 11-166835 | 6/1999 |
| JP | 2001-142469 | 5/2001 |

* cited by examiner

*Primary Examiner*—Vivian Chin
*Assistant Examiner*—Disler Paul
(74) *Attorney, Agent, or Firm*—Brinks Hofer Gilson & Lione

(57) ABSTRACT

An audio correcting apparatus includes a speaker provided on a television apparatus, a microphone provided on a remote controller, an identifying unit which identifies an acoustic characteristic from the speaker to the microphone, and an acoustic characteristic setting unit having the acoustic characteristic. A signal obtained by allowing an audio signal input to the speaker to pass through the acoustic characteristic setting unit, and a signal representing ambient noise are input to an audio-correcting filter and a loudness-compensation-gain calculating unit. Based on both signals, the sound pressure level of sound output from the speaker is corrected so that the sound output from the speaker is clearly heard when reaching the user without being affected by the ambient noise.

17 Claims, 11 Drawing Sheets

AUDIO CORRECTING APPARATUS

BACKGROUND OF THE INVENTION

1. Field of the Invention

The present invention relates to an audio correcting apparatus in which the level of sound output from a piece of equipment, such as a television set or an audio apparatus, is corrected in response to ambient noise or the like.

2. Description of the Related Art

In general, when sudden noise is generated while a person is listening to sound from a television set or the like in the home, it becomes difficult for the person to hear the sound clearly. For example, when people in the vicinity speak or make some kind of noise, or there is some external noise, such as noise from a car, it becomes difficult for the person to listen clearly to what the person is watching or listening to. In such a case, in general, the person will then naturally increase the volume. To actually increase the volume after the sudden generation of noise or the like, a certain amount of time is required during which the person may fail to hear some of the sound.

As an example of the related art which enables a person to listen to sound even if ambient noise is generated, an in-vehicle speech correcting apparatus (for a car navigation apparatus) using volume correcting technology based on acoustic theory is known (see, for example, Japanese Unexamined Patent Application Publication No. 11-166835, pages 3 to 7, FIGS. 1 to 10). This speech correcting apparatus includes a microphone provided at a listening position and performs gain correction on output sound in response to a noise level at the listening position. This enables the user of the apparatus to always be able to hear that which is represented by the sound, even if the noise level changes.

For the above speech correcting apparatus, the microphone must be provided at a position where the user listens to the sound. When considering the inside of the vehicle, in the case in which the user sits in the driver's seat, the listening position is almost fixed. Accordingly, the microphone may be actually provided at the listening position. However, when considering the case of listening to sound which is output from a television set or an audio apparatus for household use, the user will listen to the sound at his or her chosen position in a room. Accordingly, it is almost impossible to provide the microphone at that position since the required wiring is complicated. Although it is possible for the microphone to be mounted on part of the housing of the television set or the audio apparatus, it is difficult to employ such a solution because measurement of a sound pressure level at the listening position is essential for accurate volume adjustment based on volume correcting technology.

SUMMARY OF THE INVENTION

The present invention was made in view of the above circumstances. It is an object of the present invention to provide an audio correcting apparatus enabling a user to clearly listen to that which is represented by output sound, even if noise is generated.

According to an aspect of the present invention, an audio correcting apparatus is provided which includes a speaker provided on an apparatus, a first microphone provided on an operation device operated by a user, an identifying unit which identifies a first acoustic characteristic from the speaker to the first microphone, a first filter which has the first acoustic characteristic identified by the identifying unit, and an audio correcting unit which, based on two input signals, one signal being obtained by allowing an audio signal input to the speaker to pass through the first filter, and the other signal representing ambient noise, corrects the sound pressure level of sound output from the speaker so that the sound output from the speaker is clearly heard when reaching the user without being affected by the ambient noise.

Preferably, the audio correcting apparatus further includes a communication unit by which the operation device and the apparatus are linked to each other without using a connecting line.

The operation device may be a remote controller for instructing the apparatus to perform an operation.

The apparatus may be a television apparatus.

The audio correcting apparatus may further include a second microphone provided on the apparatus, and an ambient noise extracting unit which extracts the ambient noise from sound collected by the second microphone.

The audio correcting apparatus may further include a second filter having a second acoustic characteristic from the speaker to the second microphone. The ambient noise may be extracted such that a signal obtained by allowing the audio signal input to the speaker to pass through the second filter is subtracted from a signal representing the sound collected by the second microphone.

The audio correcting apparatus may further include an identification-signal generating unit which generates an identification signal for use in identifying the first acoustic characteristic and the second acoustic characteristic by the identifying unit. When the identification signal is output by the identification-signal generating unit, the identifying unit may capture and use sound collected by the first microphone to identify the first acoustic characteristic, while the identifying unit may capture and use the sound collected by the second microphone to identify the second acoustic characteristic.

The identification signal may be a white noise signal.

The speaker may be provided at a predetermined position on the housing of the apparatus, and, instead of using a result obtained by an identifying operation of the identifying unit, a fixed value based on the result of a pre-measurement may be used as the second acoustic characteristic.

The audio correcting apparatus may further include a third filter having an inverse characteristic which is the inverse of the second acoustic characteristic. The ambient noise extracting unit may extract the ambient noise by calculating a signal which is obtained by subtracting the signal obtained by allowing the audio signal input to the speaker to pass through the second filter from the signal representing the sound collected by the second microphone, and allowing the calculated signal to pass through the third filter and the first filter.

The inverse characteristic may be calculated based on the second acoustic characteristic, and, by allowing the calculated signal to pass through the third filter, the sound output from the speaker may be calculated based on sound reaching the position of the second microphone.

According to another aspect of the present invention, an audio correcting apparatus is provided which includes a speaker provided on an apparatus, a first microphone provided on an operation device operated by a user, an identifying unit which identifies a first acoustic characteristic from the speaker to the first microphone, a first filter having the first acoustic characteristic identified by the identifying unit, a second microphone provided on the apparatus, a level-change detecting unit which detects a level change in ambient noise based on sound collected by the second microphone, and an audio correcting unit which, when the level change in ambient noise is detected by the level-change detecting unit, based on two signals, one signal being obtained by allowing an audio signal input to the speaker to pass through the first filter, and the other signal representing the ambient noise, corrects the sound pressure level of sound output from the speaker so that the sound output from the speaker is clearly heard when reaching the user without being affected by the ambient noise.

Preferably, the audio correcting unit corrects the sound pressure level for each divided frequency band.

The audio correcting unit may have gain tables which correspond to the divided frequency bands, and in each of which, when the sound pressure level of the ambient noise and a desired sound pressure level in terms of auditory sense of the sound output from the speaker are designated, a correcting gain corresponding to the designated levels is found, and the audio correcting unit may correct the sound pressure level by referring to the gain tables.

The operating device may include an operation unit for instructing the apparatus to perform an operation, and the identifying unit may perform an identifying operation when the operation unit instructs the apparatus to perform the operation.

The operation device may include an operation unit for the user to instruct an audio correcting operation to be executed, and the audio correcting unit may perform the audio correcting operation when the operation unit is used by the user to instruct the audio correcting operation to be executed.

The operation device may include an operation unit for instructing the power of the apparatus to be turned on, and the audio correcting unit may perform an identifying operation when the power of the apparatus is instructed by the operation unit to be turned on.

According to another aspect of the present invention, an audio correcting method for an audio correcting apparatus is provided. The audio correcting apparatus includes a speaker provided on an apparatus, a first microphone provided on an operation device operated by a user, a first filter having a first acoustic characteristic from the speaker to the first microphone, and a second microphone provided on the apparatus. The audio correcting method includes the steps of detecting a level change in ambient noise based on sound collected by the second microphone, and, when the level change in ambient noise is detected, based on two signals, one signal being obtained by allowing an audio signal input to the speaker to pass through the first filter, and the other signal representing the ambient noise, correcting the sound pressure level of sound output from the speaker so that the sound output from the speaker is clearly heard when reaching the user without being affected by the ambient noise.

Preferably, the step of correcting the sound pressure level of the sound includes a step of correcting the sound pressure level of the sound for each divided frequency band.

The audio correcting apparatus has gain tables which correspond to the divided frequency bands, and in each of which, when the sound pressure level of the ambient noise and a desired sound pressure level in terms of auditory sense of the sound output from the speaker are designated, a correcting gain corresponding to the designated levels is found. The step of correcting the sound pressure level of the sound may include a step of correcting the sound pressure level of the sound by referring to the gain tables.

According to the present invention, by using a first microphone provided on an operation device to identify a first acoustic characteristic from an apparatus to the first microphone, and using a first filter in which the first acoustic characteristic is set, the sound pressure level of sound which reaches a listening position after being output from a speaker provided on the apparatus can be known. By correcting the sound pressure level of the sound which reaches the listening position based on the sound pressure level of ambient noise, that which is represented by the sound can be clearly heard, even if ambient noise is generated.

In addition, according to the present invention, by using a first microphone provided on an operation device to identify a first acoustic characteristic from an apparatus to the first microphone, and using a first filter in which the first acoustic characteristic is set, the sound pressure level of sound which reaches a listening position after being output from a speaker provided on the apparatus can be known. When the sound pressure level of the ambient noise changes, by using sound actually collected by the first microphone, which is provided on an operation device, the accurate sound pressure level of the ambient noise can be known. By correcting the sound pressure level of the sound which reaches the listening position based on the accurate sound pressure level of the ambient noise, that which is represented by the sound can be clearly heard, even if ambient noise is generated.

DESCRIPTION OF THE PREFERRED EMBODIMENTS

First Embodiment

A television set according to a first embodiment of the present invention is described below with reference to the accompanying drawings.

The user of the television set usually operates a remote controller in his or her hand to perform received-channel switching, etc. Accordingly, a position at which the remote controller is positioned can be considered as a user listening position at which the user listens to the sound of a broadcast program.

The television set according to the first embodiment identifies acoustic characteristics corresponding to the user listening position by measuring an acoustic impulse response at the position of the remoter controller with predetermined timing. The television set uses the identified result to perform, on the sound of a broadcast program, correction based on loudness correcting technology.

Figure 1:
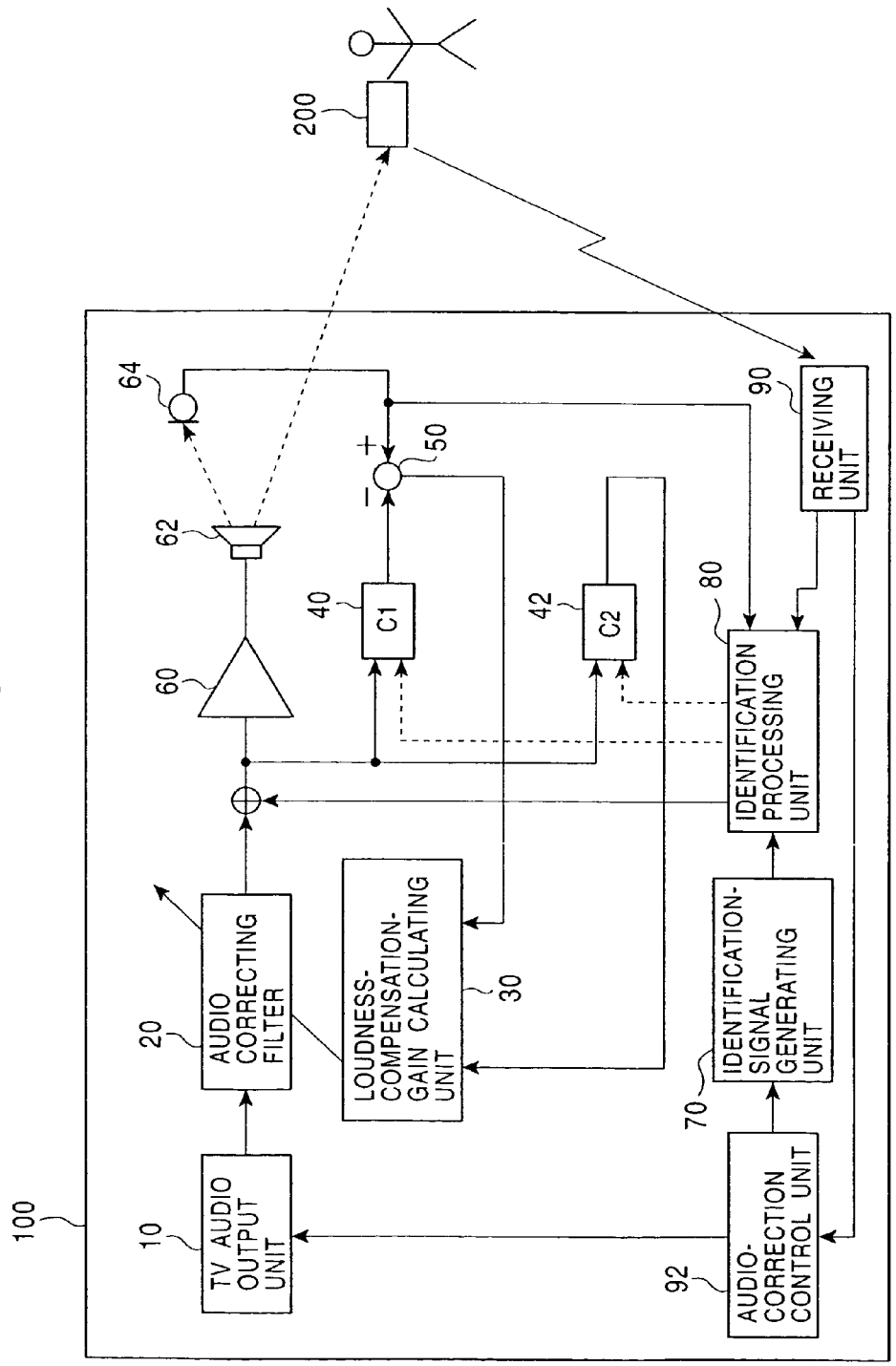
FIG. 1 is a block diagram showing the general configuration of a television set according to a first embodiment of the present invention.

FIG. 1 is a block diagram showing the general configuration of the television set according to the first embodiment. As shown in FIG. 1, the television set according to the first embodiment includes a television apparatus 100 and a remote controller 200. The television apparatus 100 and the remote controller 200 are linked to each other by, for example, infrared communication.

The television apparatus 100 includes a television (TV) audio output unit 10, an audio-correcting filter 20, a loudness-compensation-gain calculating unit 30, acoustic characteristic setting units 40 and 42, an arithmetic unit 50, an amplifier 60, a speaker 62, a microphone 64, an identification-signal generating unit 70, an identification processing unit 80, a receiving unit 90, and an audio-correction control unit 92.

The television audio output unit 10 outputs an audio signal corresponding to a broadcast program on a channel selected by the user. The audio-correcting filter 20 performs gain adjustment on the audio signal output from the television audio output unit 10. The loudness-compensation-gain calculating unit 30 sets the gain of the audio-correcting filter 20 so that the clearness of sound which can be heard by the user after the sound is output from the speaker 62 is substantially constant regardless of ambient noise. In the television set according to the first embodiment, based on the sound pressure level of sound at the user listening position, the gain of the audio-correcting filter 20 is adjusted, whereby the user can always hear the sound with equal loudness.

The acoustic characteristic setting unit 40 is a filter in which acoustic characteristic C1 is set. Acoustic characteristic C1 corresponds to an acoustic impulse response from the speaker 62 to the microphone 64. By allowing an audio signal input to the speaker 62 to pass through the acoustic characteristic setting unit 40, an impulse response of sound which reaches the microphone 64 after being output from the speaker 62 can be reproduced.

The acoustic characteristic setting unit 42 is a filter in which acoustic characteristic C2 is set. Acoustic characteristic C2 corresponds to an acoustic impulse response, which has been identified beforehand, from the speaker 62 to a built-in microphone (described later) of the remote controller 200. By allowing an audio signal input to the speaker 62 to pass through the acoustic characteristic setting unit 42, an impulse response of sound which reaches the remote controller 200 after being output from the speaker 62 can be reproduced.

The amplifier 60 amplifies the audio signal output from the audio-correcting filter 20 and drives the speaker 62. The microphone 64 is provided on the housing of the television apparatus 100. The microphone 64 collects sound which is output into the space surrounding the television apparatus 100, and other sound such as noise.

The identification-signal generating unit 70 generates an identification signal for use in identifying acoustic characteristic C1 from the speaker 62 to the microphone 64, and acoustic characteristic C2 from the speaker 62 to the remote controller 200. For example, a white noise signal is used as the identification signal. The identification processing unit 80 identifies two acoustic characteristics C1 and C2 by using the identification signal output from the identification-signal generating unit 70. The receiving unit 90 receives an infrared signal transmitted from the remote controller 200.

The audio-correction control unit 92 performs the consecutive control for performing audio-correction processing using the loudness correcting technology. By way of example, when the audio-correction control unit 92 identifies acoustic characteristics C1 and C2, it instructs the identification-signal generating unit 70 to generate the identification signal, and simultaneously instructs the television audio output unit 10 to stop outputting an ordinary audio signal of a broadcast program.

Figure 2:
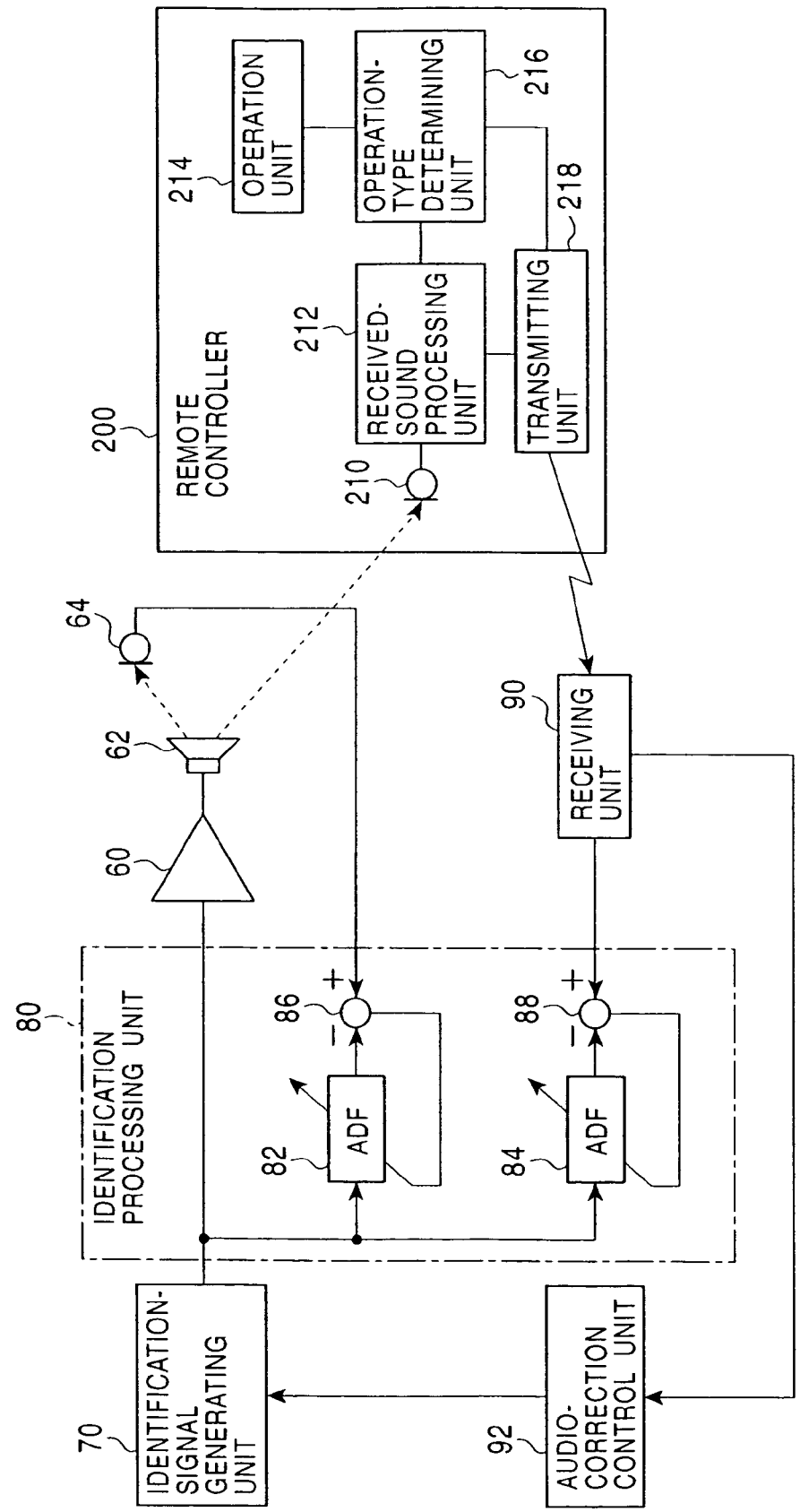
FIG. 2 is a more detailed block diagram showing the configurations of an identification processing unit and a remote controller.

FIG. 2 is a more detailed block diagram showing the configurations of the identification processing unit 80 and the remote controller 200.

As shown in FIG. 2, the identification processing unit 80 includes two adaptive filters (ADFs) 82 and 84, and two arithmetic units 86 and 88. One adaptive filter 82 is used to identify acoustic characteristic C1 from the speaker 62 to the microphone 64, while the other adaptive filter 84 is used to identify acoustic characteristic C2 from the speaker 62 to the remote controller 200. Acoustic characteristics (filter factors) for the adaptive filters 82 and 84 are determined by using, for example, the least mean square algorithm.

The arithmetic unit 86 outputs an error obtained by subtracting, from a signal output from the microphone 64, a signal passing through the adaptive filter 82. The identification signal output from the identification-signal generating unit 70 is input to the adaptive filter 82. At the same time, the identification signal passes through an amplifier 60 before being output from the speaker 62, and reaches the microphone 64. Therefore, by determining the acoustic characteristic of the adaptive filter 82 so that the power of the error output from the arithmetic unit 86 is minimized, the determined acoustic characteristic can be set to correspond to the acoustic impulse response from the speaker 62 to the microphone 64.

The arithmetic unit 88 outputs an error obtained by subtracting, from a signal of sound collected by the remote controller 200, a signal passing through the adaptive filter 84. The identification signal output from the identification-signal generating unit 70 is input to the adaptive filter 84. At the same time, the identification signal passes through the amplifier 60 before being output from the speaker 62, and reaches the remote controller 200. Therefore, by determining the acoustic characteristic of the adaptive filter 84 so that the power of the error output from the arithmetic unit 88 is minimized, the determined acoustic characteristic can be set to correspond to the acoustic impulse response from the speaker 62 to the remote controller 200.

Also, as shown in FIG. 2, the remote controller 200 includes a microphone 210, a received-sound processing unit 212, an operation unit 214, an operation-type determining unit 216, and a transmitting unit 218. The microphone 210 is provided on the housing of the remote controller 200, and collects sound corresponding to the identification signal output from the speaker 62 in the television apparatus 100. The received-sound processing unit 212 converts a sound signal output from the microphone 210 into a data format adapted for transmission.

The operation unit 214 includes various keys which are necessary for performing various operations, such as tuning, volume setting, and tone setting, and an "Identify" key for ordering the execution of identification processing by the user. The operation unit 214 outputs a signal specifying a pressed key. The "Identify" key may be used to order the execution of the audio correcting operation including the identification processing. The operation-type determining unit 216 determines, based on a signal output from the operation unit 214, a type of operation instructed by the user. The transmitting unit 218 transmits, to the receiving unit 90 in the television apparatus 100, the type of operation determined by the operation-type determining unit 216. When the "Identify" key of the operation unit 214 is pressed by the user, the received-sound processing unit 212 operates for a predetermined time, and sound data converted into a predetermined data format is transmitted from the transmitting unit 218 to the television apparatus 100.

The identification processing unit 80 corresponds to an identifying unit. The acoustic characteristic setting unit 42 corresponds to a first filter. The acoustic characteristic setting unit 40 corresponds to a second filter. The audio-correcting filter 20 and the loudness-compensation-gain calculating unit 30 correspond to an audio correcting unit. The arithmetic unit 50 and the acoustic characteristic setting unit 40 correspond to an ambient noise extracting unit. The transmitting unit 218 and the receiving unit 90 correspond to a communication unit.

The television set according to the first embodiment has the above-described configuration. Its operation is described below.

1. Principle of Audio Correction

At first, a principle of television-audio-gain correction is described.

Figure 3:
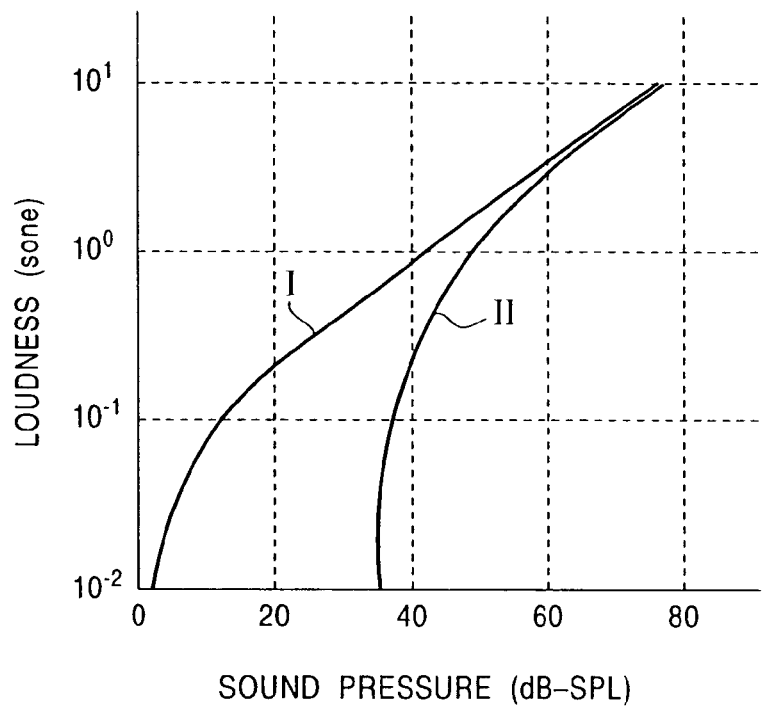
FIG. 3 is a graph showing relationships (loudness curves) between the physical sound pressure level of a sound, and the loudness of the sound experienced by a person when the person hears the sound.

FIG. 3 shows relationships (loudness curves) between a physical sound pressure level of sound, and the loudness of the sound experienced by a person when the person hears the sound. In FIG. 3, the horizontal axis indicates the sound pressure level (in units of dB-SPL), and the vertical axis indicates loudness (in units of sones) representing the magnitude of sound experienced by a person. Curve I indicates a loudness curve in a state of quiet, and curve II indicates a loudness curve in a state of noise. Curve II changes depending on the noise level.

Referring to FIG. 3, when two sounds have equal loudness values, a person is able to register that both sounds have the same magnitude. Accordingly, for example, a sound having a loudness registered as 0.1 sones by a person has a sound pressure level of approximately 12 dB-SPL in the quiet state, and has a sound pressure level of approximately 37 dB-SPL in the state of noise. In other words, in order for a sound which is output at approximately 12 dB-SPL in the quiet state to be registered as a sound of the same loudness in the state of noise, a sound at approximately 37 dB-SPL must be output. In other words, in the state of noise indicated by curve II, a gain of approximately 25 dB must be added. Also, a sound having a magnitude registered as 1 sone has a sound pressure level of approximately 42 dB in the quiet state, and has a sound pressure level of approximately 49 dB-SPL in the state of noise. Thus, in the state of noise, a gain of approximately 7 dB must be added. Therefore, in the same quiet state, a gain to be added in response to the sound pressure level of an output sound must be changed.

Figure 4:
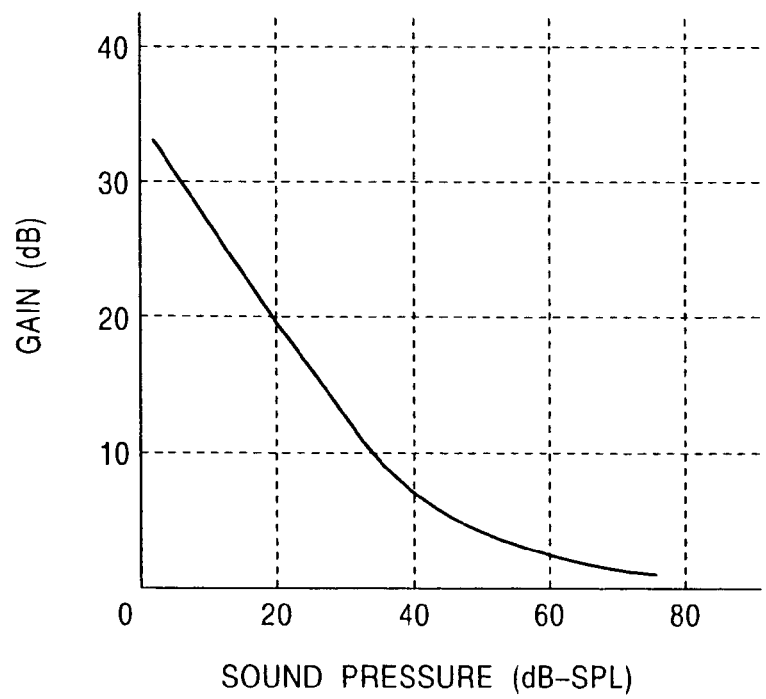
FIG. 4 is a graph showing the amount of gain needed to be added to a sound pressure in a state of quiet in order for a person in a state of noise to register a sound which is equal in loudness to that in the quiet state.

FIG. 4 is a graph showing how much gain must be added to the sound pressure level in the quiet state in order to register a sound in the state of noise. In FIG. 4, the horizontal axis represents the sound pressure level of sound which is output in the quiet state, and the vertical axis represents the gain required to be added to a sound in the state of noise so that the sound can be registered identically to a sound in the quiet state. For example, in the state of noise, by adding a gain of approximately 19 dB to a sound that is output at a sound pressure level of 20 dB in the quiet state, a person can register that the sound is equal in loudness to that in the quiet state.

In the loudness-compensation-gain calculating unit 30, an internal memory stores relationships (hereinafter referred to as "gain tables") as shown in FIG. 4 between sound pressure levels (sound pressure levels of an audio signal output from the television audio output unit 10) of television audio at various noise levels and gains to be added. The loudness-compensation-gain calculating unit 30 selects an optimal gain table based on a noise signal output from the arithmetic unit 50, and calculates an optimal gain based on the selected gain table and an audio signal output from the acoustic characteristic setting unit 42. The loudness-compensation-gain calculating unit 30 sets an acoustic characteristic of the audio-correcting filter 20 so that the calculated gain is obtained.

In general, television audio has various frequency components, and the frequency components have different sound pressure levels. Accordingly, imbalance occurs in that difficulty in listening to television sound differs depending on the sound pressure level of each frequency component of a television audio signal and a noise signal. In addition, frequency components of the noise signal exert a masking effect on the television audio signal, which has high frequency components. Accordingly, this also needs to be considered.

Therefore, it is preferable that an optimal gain be set for each frequency component of the television audio signal. In other words, it is preferable to divide each of the television audio signal and the noise signal into predetermined frequency bands; select, for each frequency band, an optimal gain table based on a frequency component of the noise signal; and calculate an optimal gain based on the selected gain table and a frequency component of the television audio signal.

2. Operation of Television Set in Normal Mode

The audio signal of the broadcast program output from the television audio output unit 10 is input to the amplifier 60 through the audio-correcting filter 20. The amplified signal is output from the speaker 62. The microphone 64 provided on the television apparatus 100 collects ambient sound as well as the sound of the broadcast program, and outputs the resultant combined audio signal to the arithmetic unit 50. In the arithmetic unit 50, in addition to the audio signal output from the microphone 64, an audio signal of the broadcast program which passes through the acoustic characteristic setting unit 40, in which acoustic characteristic C1 is set, is input. An ambient noise signal, which is the difference between both, is extracted and input to the loudness-compensation-gain calculating unit 30. The audio signal of the broadcast program output from the audio-correcting filter 20 is input to the acoustic characteristic setting unit 42, in which acoustic characteristic C2 from the speaker 62 to the microphone 210 in the remote controller 200 is set. An audio signal of the broadcast program obtained at a position at which the microphone 210 is provided is generated and input to the loudness-compensation-gain calculating unit 30.

Based on the sound pressure level of the ambient noise signal which is input from the arithmetic unit 50, the loudness-compensation-gain calculating unit 30 sets the gain of the audio-correcting filter 20 so that the sound pressure level of the audio signal of the broadcast program at the listening position (the position at which the microphone 210 in the remote controller 200 is provided), input from the acoustic characteristic setting unit 42, is a predetermined value.

3. Operations of Identifying Acoustic Characteristics C1 and C2

Next, the operations of identifying acoustic characteristics C1 and C2 by the acoustic characteristic setting units 40 and 42, performed before the above operation of the television set in normal mode, are described below.

3-1. Operation of Remote Controller 200

Figure 5:
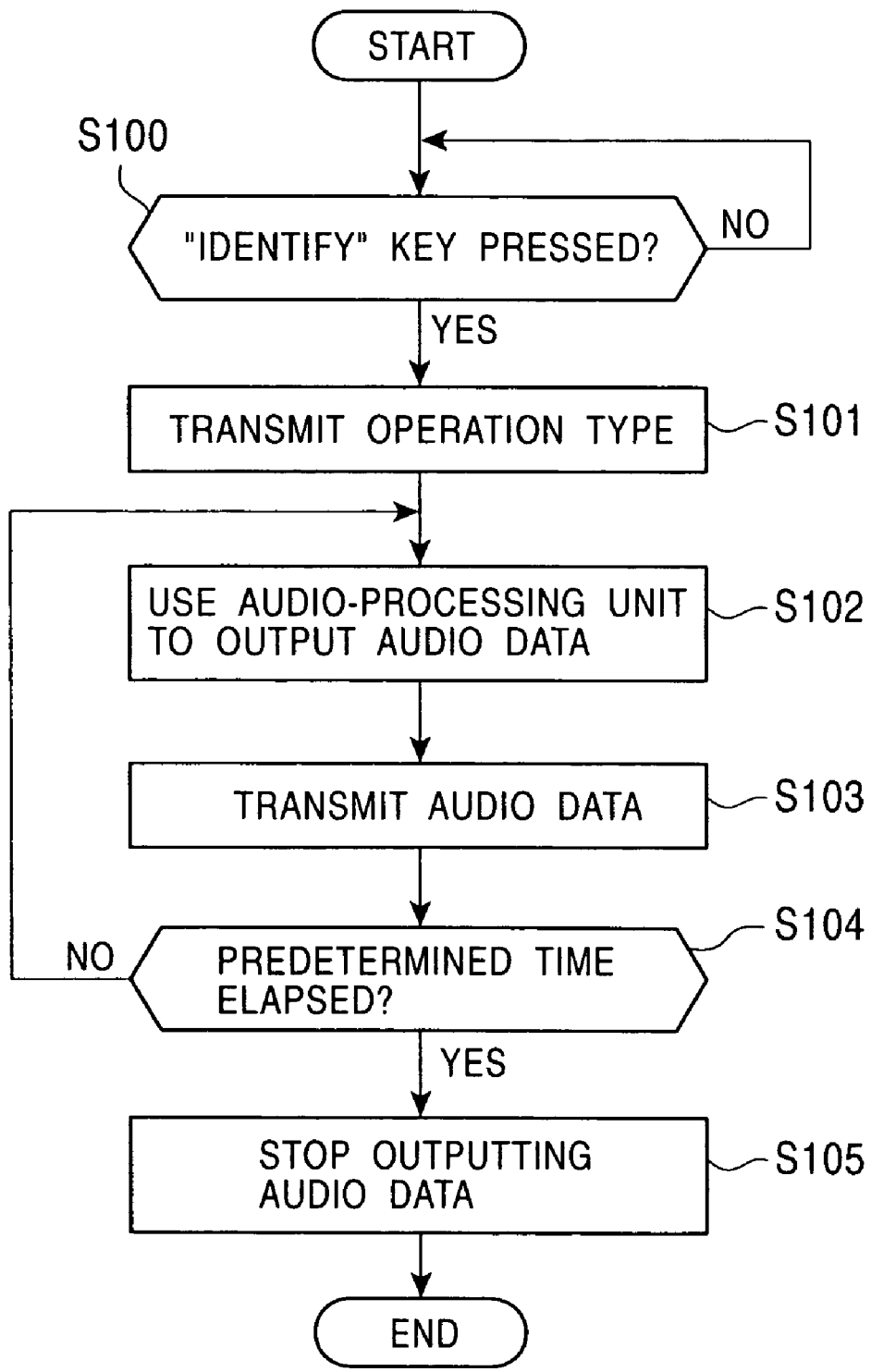
FIG. 5 is a flowchart of a process in which the remote controller operates in an identifying mode.

FIG. 5 is a flowchart of an operation process of the remote controller 200 in the identifying mode. In parallel with ordinary operation-type determinations, such as a tuning operation and a volume-adjusting operation, in step S100, the operation-type determining unit 216 in the remote controller 200 determines whether the "Identify" key has been pressed. If the "Identify" key has not been pressed, the determination is negative.

Pressing the "Identify" key on the operation unit 214 by the user results in an affirmative determination in step S100. Next, in step S101, the operation-type determining unit 216 instructs the transmitting unit 218 to transmit operation-type representing data (indicating that the "Identify" key has been pressed) to the television apparatus 100.

The operation-type determining unit 216 sends an operation-start instruction to the received-sound processing unit 212. In step S102, in response to this instruction, the received-sound processing unit 212 outputs sound data obtained by converting the sound signal output from the microphone 210 into a predetermined data format. In step S103, the transmitting unit 218 transmits, to the receiving unit 90 in the television apparatus 100, the sound data output from the received-sound processing unit 212.

Next, in step S104, the operation-type determining unit 216 determines whether a predetermined time has elapsed after, for example, the pressing of the "Identify" key. If the predetermined time has not elapsed, the operation-type determining unit 216 determines negatively. In this case, returning to step S102, processing beginning with the operation of outputting the sound data by the received-sound processing unit 212 is performed again.

If the predetermined time has elapsed, the operation-type determining unit 216 determines affirmatively in step S104. Next, the operation-type determining unit 216 sends an operation-ending instruction to the received-sound processing unit 212. In response to this instruction, in step S105, the received-sound processing unit 212 ends the process of outputting sound data obtained by converting the sound signal output from the microphone 210.

In this manner, when the "Identify" key is pressed by the user, the television apparatus 100 is notified of the pressing, and the microphone 210 is used to collect sound within a predetermined time. An operation of transmitting sound data obtained by the sound collection to the television apparatus 100 is performed.

3-2. Operation of Television Apparatus 100

Figure 6:
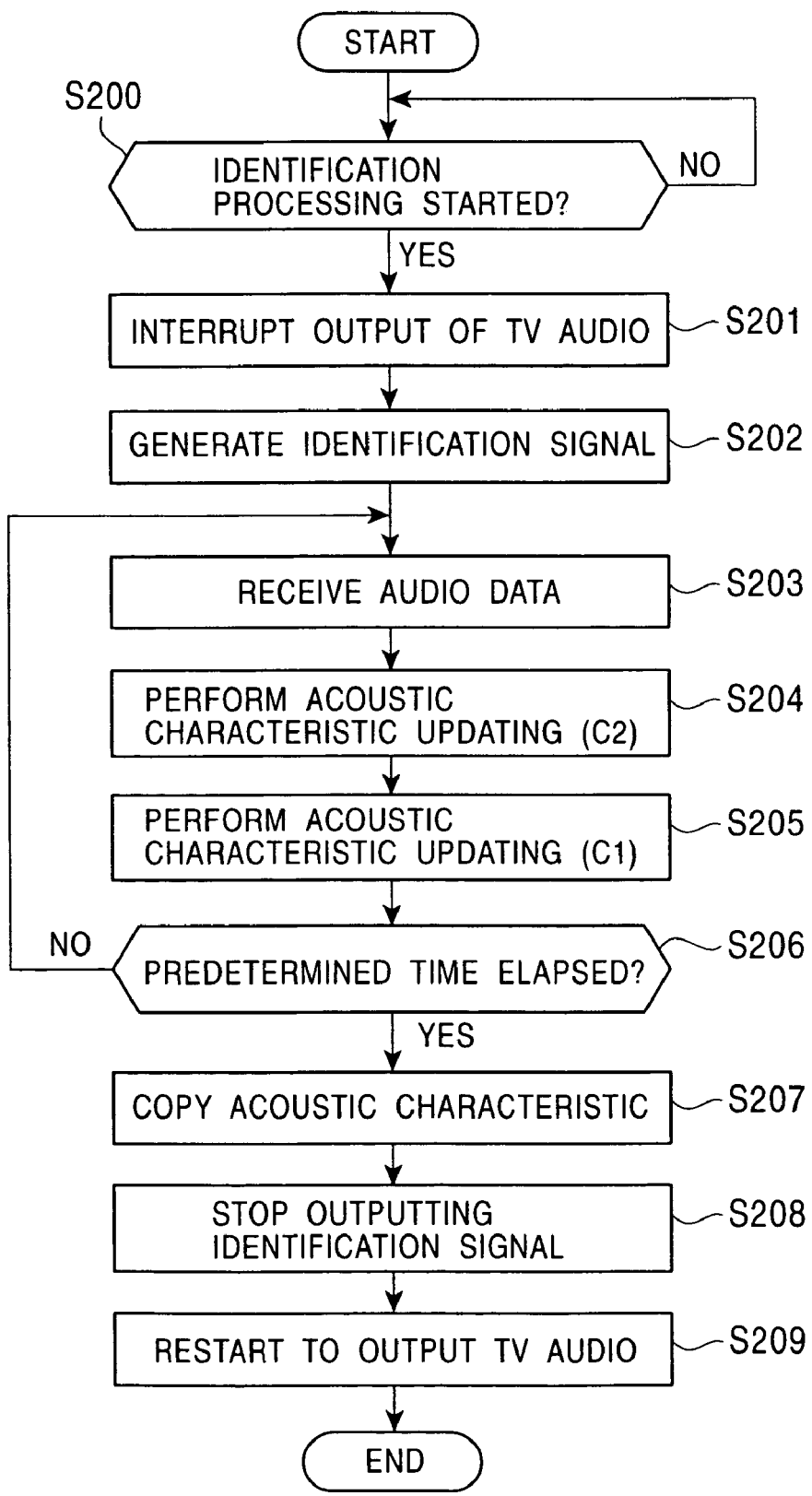
FIG. 6 is a flowchart of a process in which the television apparatus operates in an identifying mode.

FIG. 6 is a flowchart of an operation process of the television apparatus 100 in the identifying mode. In parallel with an ordinary-mode operation of outputting the audio signal of the broadcast program, in step S200, the audio-correction control unit 92 in the television apparatus 100 determines whether to start an identifying process. The audio-correction control unit 92 performs this determination by monitoring reception of the data which is transmitted to the receiving unit 90 when the "Identify" key is pressed. When the data is not received, the audio-correction control unit 92 determines negatively, and this determination is repeated.

In a case in which pressing of the "Identify" key on the operation unit 214 in the remote controller 200 by the user allows the receiving unit 90 to receive data representing the pressing, the result of the determination in step S200 is affirmative. Next, in step S201, the audio-correction control unit 92 instructs the television audio output unit 10 to interrupt the output of the television sound. The audio-correction control unit 92 instructs the identification-signal generating unit 70 to start an identification-signal generating operation of the identification-signal generating unit 70 in step S202.

After that, the speaker 62 outputs sound corresponding to the identification signal. The output sound is collected by the microphone 210 in the remote controller 200, and the sound data transmitted from the transmitting unit 218 in the remote controller 200 is received by the receiving unit 90 in step S203.

In step S204, the adaptive filter 84 in the identification processing unit 80 uses the LMS algorithm to update an acoustic characteristic so that the power of an error obtained by subtracting the identification signal directly input by the identification-signal generating unit 70 from a signal of the sound collected by the microphone 210 in the remote controller 200 which is received by the receiving unit 90 is minimized.

In step S205, the adaptive filter 82 uses the LMS algorithm to update an acoustic characteristic so that the power of an error obtained by subtracting the identification signal directly input by the identification-signal generating unit 70 from the signal of the sound collected by the microphone 64 provided on the television apparatus 100 is minimized.

In step S206, the audio-correction control unit 92 determines whether a predetermined time has elapsed after the start of the identification process. If the predetermined time has not elapsed yet, the audio-correction control unit 92 determines negatively, and returns to step S203. Processing beginning with the operation of receiving the sound data by the receiving unit 90 is repeated. The time required for this determination is set to such a time (e.g., one second) that the acoustic characteristics of the adaptive filters 82 and 84 substantially converge.

If the predetermined time has elapsed after the start of the identification process, the audio-correction control unit 92 determines affirmatively in step S206. Next, in step S207, the audio-correction control unit 92 copies the acoustic characteristic of the adaptive filter 82 to the acoustic characteristic C1 of the acoustic characteristic setting unit 40, and copies the acoustic characteristic of the adaptive filter 84 to the acoustic characteristic C2 of the acoustic characteristic setting unit 42. In step S208, the audio-correction control unit 92 instructs the identification-signal generating unit 70 to stop outputting the identification signal.

After the identification process, which is consecutive, ends as described above, in step S209, the audio-correction control unit 92 instructs the television audio output unit 10 to again output television sound.

4. Other Configurations

Next, common configurations of the loudness-compensation-gain calculating unit 30 and the audio-correcting filter 20 are described below.

4-1. Detailed Configuration of Loudness-Compensation-Gain Calculating Unit 30.

Figure 7:
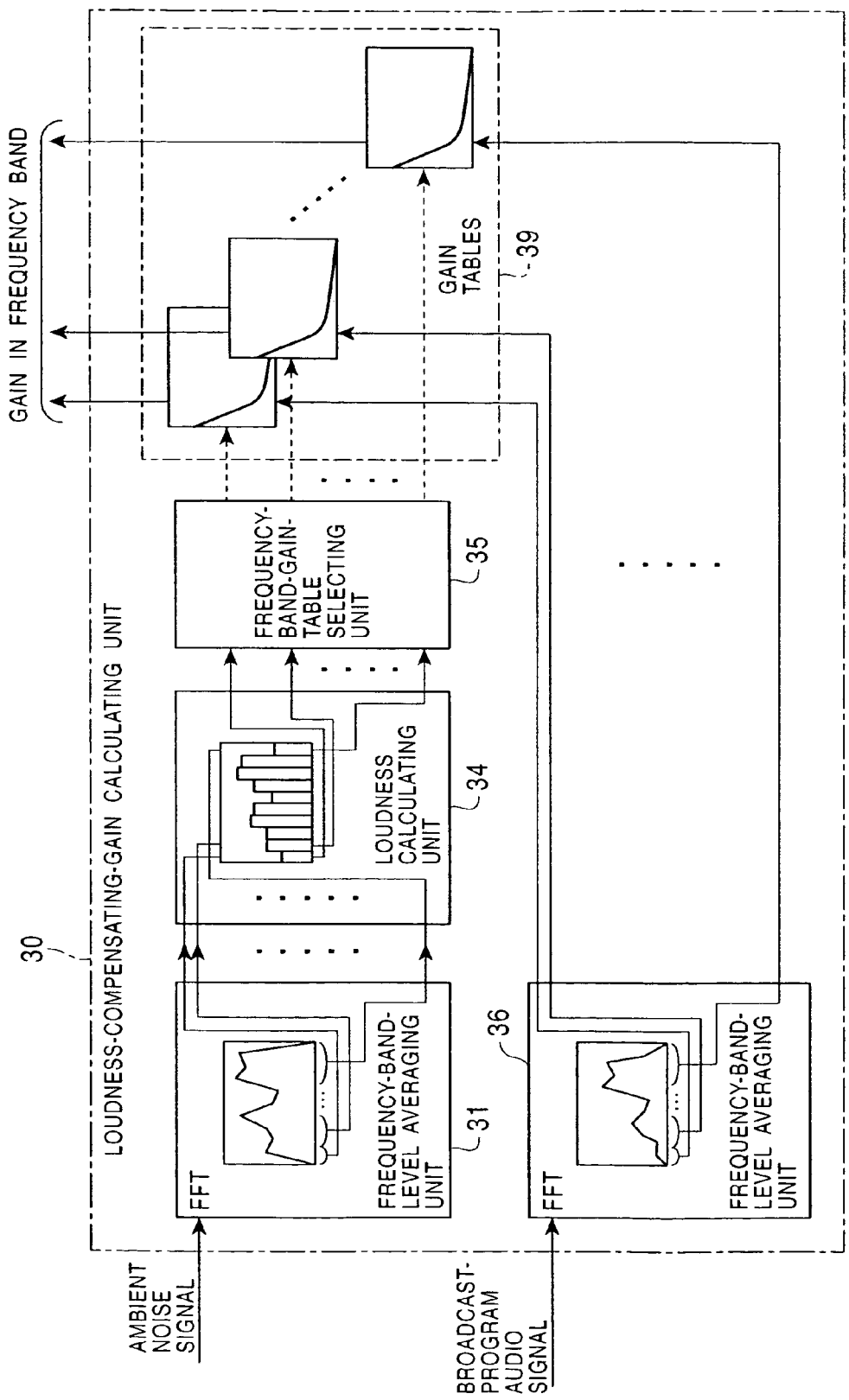
FIG. 7 is a block diagram showing a loudness-compensation-gain calculating unit.

FIG. 7 shows the configuration of the loudness-compensation-gain calculating unit 30. As shown in FIG. 7, the loudness-compensation-gain calculating unit 30 includes a frequency-band-level averaging unit 31, a loudness calculating unit 34, a frequency-band-gain-table selecting unit 35, a frequency-band-level averaging unit 36, and gain tables 39.

The frequency-band-level averaging unit 31 calculates the average of sound pressure levels for each predetermined frequency band by performing the known Fast Fourier Transform (FFT) calculation on the ambient noise signal output from the arithmetic unit 50 for each time block. The ambient noise or the like can be divided in frequency in units of ⅓ octave when considering a characteristic of human auditory sense capable of recognizing a difference in sound every approximately ⅓ octave.

The loudness calculating unit 34 uses the known Zwicker loudness-calculating technique (ISO 523B) or Stevens loudness-calculating technique (ISO 532A) to adjust the sound pressure level of an ambient noise signal which is output for each frequency band from the frequency-band-level averaging unit 31. Specifically, the loudness calculating unit 34 performs the following adjustment. When there is ambient noise having a frequency component, the ambient noise affects not only listening to broadcast program sound having an equal frequency component, but also broadcast program sound having an adjacent higher frequency component, as described above. By considering this feature, the loudness calculating unit 34 adjusts the sound pressure level of ambient noise in each frequency component in response to the sound pressure level of ambient noise having an adjacent lower frequency component. In other words, when the sound pressure level of ambient noise having an adjacent lower frequency component is large, the sound pressure level of ambient noise having a higher frequency component is corrected to be relatively high. By performing such an adjustment, in the case of selecting a gain table for each frequency band, the sound pressure level of ambient noise having each corresponding frequency band only needs to be noted, so that the need to perform complicated processing of considering ambient noise having a lower adjacent frequency band is eliminated.

Based on the adjusted sound pressure level of ambient noise in each frequency band which is output from the loudness calculating unit 34, the frequency-band-gain-table selecting unit 35 selects one of the gain tables 39 which is optimal for each frequency band.

The frequency-band-level averaging unit 36 calculates a sound-pressure-level average for each predetermined frequency band by performing the known FFT calculation in each block of short time on the audio signal of the broadcast program output from the acoustic characteristic setting unit 42. The audio signal of the broadcast program is divided into frequency bands similar to those of the ambient noise. The audio signal of the broadcast program in a form divided into the frequency bands, output from the frequency-band-level averaging unit 36, is input to the gain table 39 selected by the frequency-band-gain-table selecting unit 35, and appropriate gain values for the frequency bands are calculated.

As described above, by dividing an ambient noise signal and a broadcast-program audio signal into predetermined frequency bands, selection of a gain table for each frequency band enables the addition of an appropriate gain to the broadcast-program audio signal.

In the above loudness-compensation-gain calculating unit 30, the frequency-band-level averaging units 31 and 36 are used to calculate a sound-pressure-level pressure-level average for each frequency band of the audio signal of the broadcast program and the ambient noise signal, respectively. However, instead of the frequency-band-level averaging units 31 and 36, a sound-pressure-level average for each frequency band may be calculated by using a filter bank and a block averaging unit.

Figure 8:
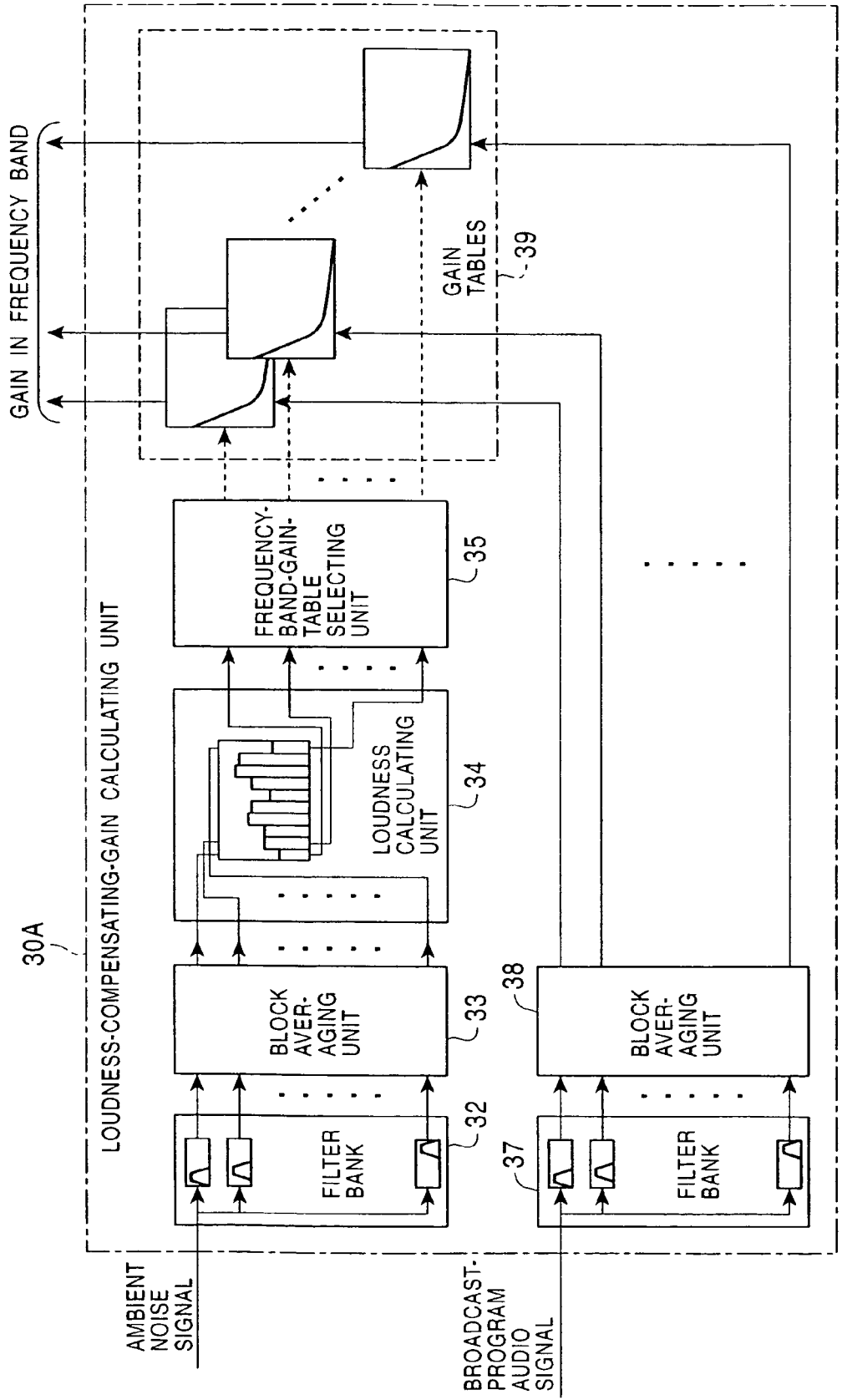
FIG. 8 is a block diagram showing a modification of the loudness-compensation-gain calculating unit.

FIG. 8 shows a loudness-compensation-gain calculating unit 30A which is a modification of the loudness-compensation-gain calculating unit 30. The loudness-compensation-gain calculating unit 30A includes a filter bank 32, a block averaging unit 33, a loudness calculating unit 34, a frequency-band-gain-table selecting unit 35, a filter bank 37, a block averaging unit 38, and gain tables 39.

The filter bank 32 is a group of bandpass filters having predetermined frequency bandwidths. The bandpass filters divide an ambient noise signal output from the arithmetic unit 50 into predetermined frequency bands. The block averaging unit 33 averages, in each time block, the sound pressure levels of the ambient noise divided into the frequency bands, and outputs the average to the loudness calculating unit 34.

Similar to the filter bank 32, the filter bank 37 is a group of bandpass filters having predetermined frequency bandwidths. The group of bandpass filters divides a broadcast-program audio signal output from the acoustic characteristic setting unit 42 into predetermined frequency bands. The block averaging unit 38 averages the ambient noise levels of the broadcast-program audio signal divided into the frequency bands, and outputs the average sound pressure level to the gain tables 39.

As described above, also by using the filter bank 37 and the block averaging unit 38, an ambient noise signal and a broadcast-program audio signal can be divided into predetermined frequency bands, and by selecting gain tables for the frequency bands, optimal gains can be added to the broadcast-program audio signal.

4-2. Detailed Configuration of Audio-correcting filter 20

It is possible for the audio-correcting filter 20 to have various configurations since the audio-correcting filter 20 only needs to perform correction (gain addition) by the gain characteristic calculated by the above-described loudness-compensation-gain calculating unit 30.

Figure 9:
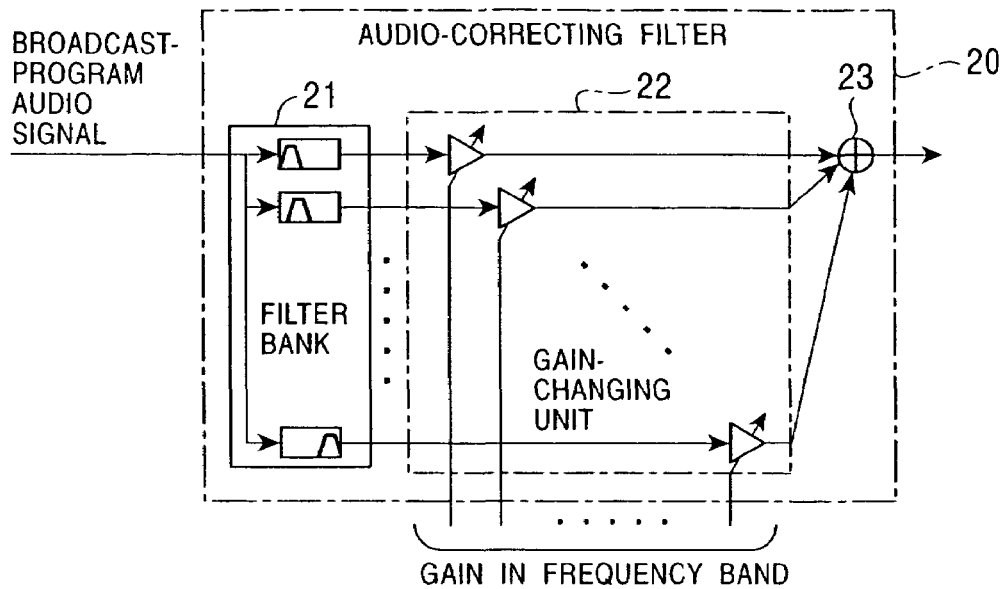
FIG. 9 is a block diagram showing a specific example of an audio-correcting filter using a filter bank and a gain changing unit.

FIG. 9 shows a specific example of the audio-correcting filter 20. The audio-correcting filter 20 shown in FIG. 9 includes a filter bank 21, a gain changing unit 22, and an adder 23.

The filter bank 21 is a group of bandpass filters having predetermined frequency bandwidths. The group of bandpass filters divides a broadcast-program audio signal into frequency bands. The gain changing unit 22 performs gain adjustment by supplying the gain for each frequency band calculated by the loudness-compensation-gain calculating unit 30 to the sound pressure level (of the broadcast-program audio signal) of each frequency band which is output from the filter bank 21. The adder 23 realizes the desired correction of gain by outputting the sum of the gain-adjusted broadcast-program audio signals for the frequency bands. According to this configuration, an analog circuit is used to inexpensively form the audio-correcting filter 20.

Figure 10:
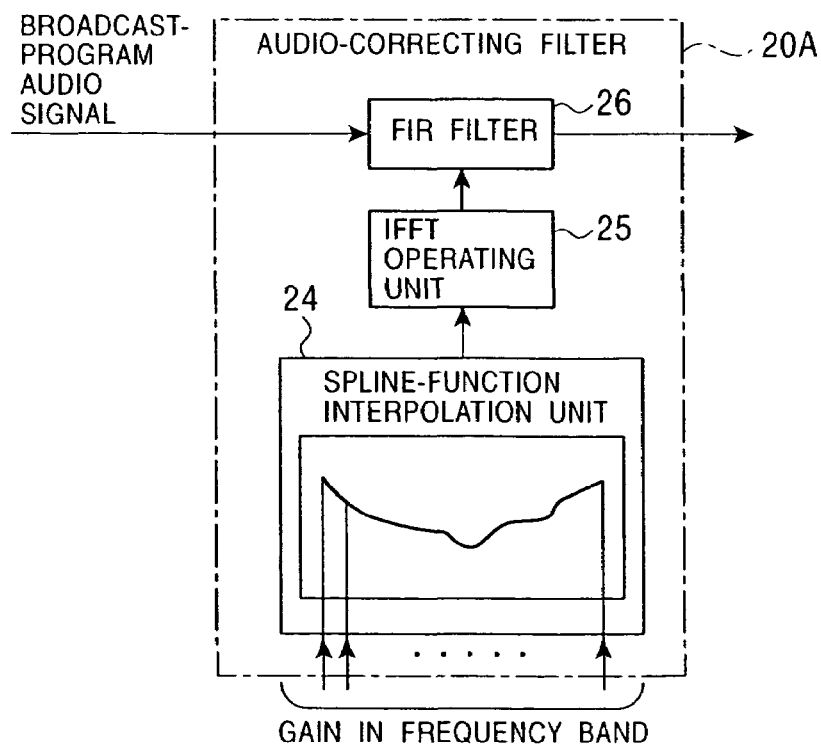
FIG. 10 is a block diagram showing another example of the audio-correcting filter, which uses a frequency sampling filter.

FIG. 10 shows another example of an audio-correcting filter using a frequency sampling filter. The audio-correcting filter 20A shown in FIG. 10 includes a spline function interpolating unit 24, an Inverse Fast Fourier Transform (IFFT) arithmetic unit 25, and a finite impulse response (FIR) filter 26.

The spline function interpolating unit 24 uses the gain for each frequency band calculated by the loudness-compensation-gain calculating unit 30, as the gain of the central frequency of the frequency band, to perform interpolation on the gains by using the known spline function, whereby smooth gain characteristics in the frequency bands can be obtained. The IFFT arithmetic unit 25 uses the known IFFT arithmetic operation to convert the gain characteristics output from the spline function interpolating unit 24 from a frequency domain into a time domain, and sets the value of a tap coefficient in the FIR filter 26. The FIR filter 26 realizes the desired correction of gain by performing time-domain filtering on the broadcast-program audio signal. In this configuration, a linear phase filter is realized, and correction on the broadcast-program audio signal can be performed not for each frequency band but for all frequency bands.

Figure 11:
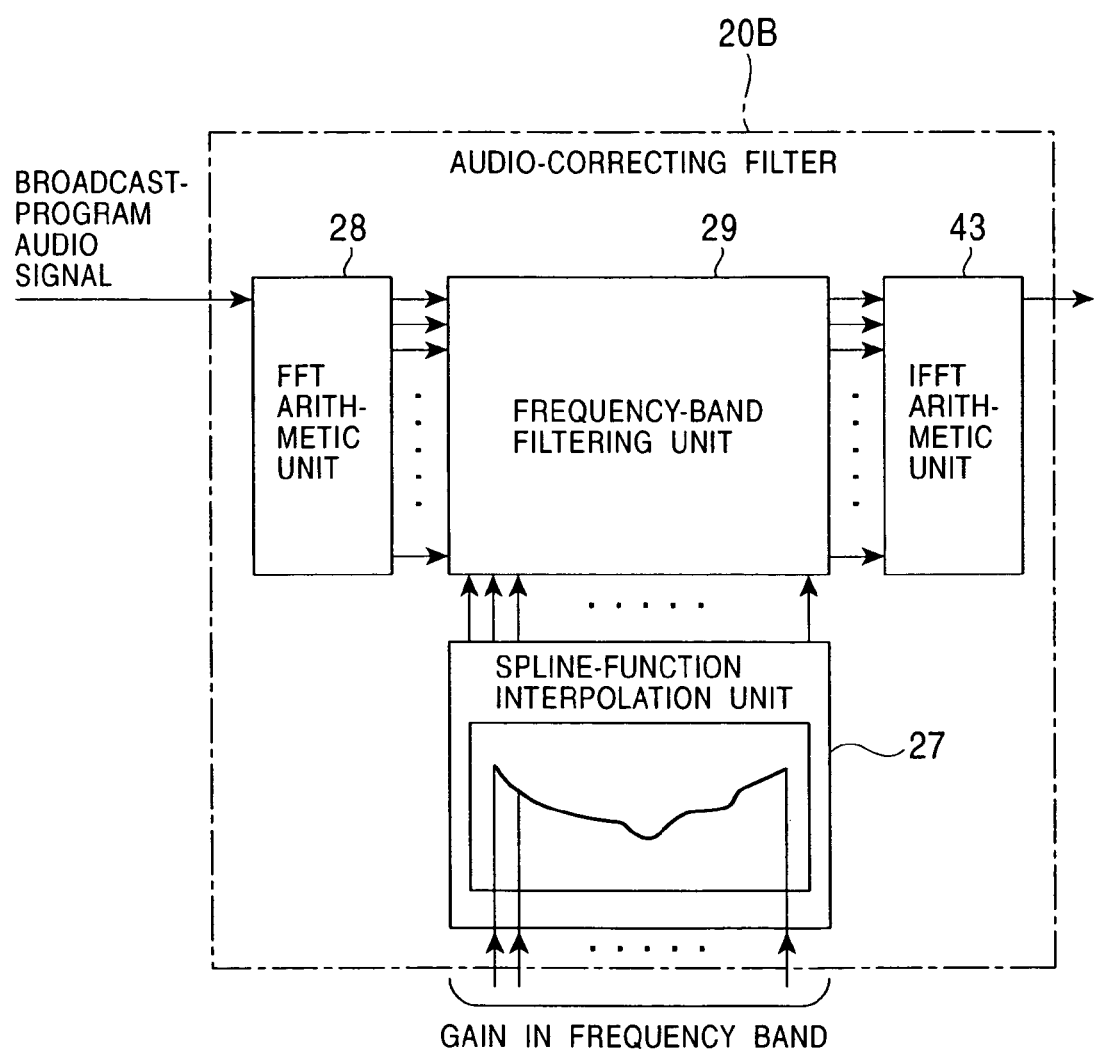
FIG. 11 is a block diagram showing another example of the audio-correcting filter, which uses a frequency-domain filter.

FIG. 11 shows another example of the audio-correcting filter which uses a frequency-domain filter. The audio-correcting filter shown in FIG. 11 includes a spline function interpolating unit 27, an FFT arithmetic unit 28, a frequency-domain filtering unit 29, and an IFFT arithmetic unit 43.

The spline function interpolating unit 27 uses the gain for each frequency band calculated by the loudness-compensation-gain calculating unit 30, as the gain of the central frequency of the frequency band, to perform interpolation on the gains by using the known spline function, whereby smooth gain characteristics in the frequency bands can be obtained. The FFT arithmetic unit 28 converts the broadcast-program audio signal from a time domain into a frequency domain by performing the FFT arithmetic operation on the audio signal. The frequency-domain filtering unit 29 performs filtering on the broadcast-program audio signal in the frequency domain output from the FFT arithmetic unit 28 by using the smooth gain characteristics output from the spline function interpolating unit 27. The IFFT arithmetic unit 43 realizes the desired correction of gain by performing the IFFT arithmetic operation to convert the broadcast-program audio signal output from the frequency-domain filtering unit 29 from a frequency domain into a time domain. In the process of the IFFT arithmetic operation, the known overlap-add method and overlap-save method may be used in order to realize linear filtering. This configuration can relatively reduce the number of operations, even if the number of taps of filters is large.

In each case of the above three audio-correcting filters 20, 20A, and 20B, a sudden change in gain causes a discontinuous waveform. Thus, it is preferable to gradually update a gain characteristic by using the following expression:

$$G(n)=\alpha G(n-1)+\beta Gm$$

where G(n) represents a gain characteristic at time n, G(n-1) represents a gain characteristic at time n-1, and Gm represents a gain characteristic calculated by the loudness-compensation-gain calculating unit 30, the spline function interpolating unit 24 or 27, or the like. In the above expression, $\alpha$ and $\beta$ represent coefficients and have the relationship represented by $\alpha+\beta=1$.

As described above, when the user operates the remote controller 200, the position of the remote controller 200 can be considered as a position at which the user listens. Accordingly, by providing the remote controller 200 with the microphone 210, identifying acoustic characteristics from the television apparatus 100 to the microphone 210, and using the acoustic characteristic setting unit 42, in which the acoustic characteristics are set, the sound pressure level of sound which is output from the microphone 64 and reaches the listening position can be known. Based on the sound pressure level of the ambient noise, by correcting the sound pressure level of the sound which reaches the listening position, that which is represented by the output sound can be clearly heard, even if noise is generated.

The remote controller 200 and the television apparatus 100 are linked in communication with each other using infrared radiation without using any connecting line. Thus, even if the user freely moves around the television apparatus 100, correction of a sound pressure level in response to the position of the user can be implemented without performing complicated wiring or the like.

In addition, the identification-signal generating unit 70 which generates an identification signal for use in identifying an acoustic characteristic is provided, and the identification processing unit 80 uses the identification signal, which is output from the identification-signal generating unit 70, to identify the acoustic characteristics of the acoustic characteristic setting units 40 and 42. By using a signal adapted for identification to perform an identifying operation, an accurate acoustic characteristic can be found. In particular, by using a white noise signal as the identification signal, an accurate acoustic characteristic can be found in which each frequency component included in an audio-frequency range is considered.

By extracting ambient noise from sound collected by the microphone 64 provided on the television apparatus 100, the need to perform special wiring or the like is eliminated, thus facilitating detection of the sound pressure level of the ambient noise. In particular, by subtracting, from a signal of the sound collected by the microphone 64, a signal obtained by allowing the audio signal input to the speaker 62 to pass through the acoustic characteristic setting unit 42 having acoustic characteristic C2 from the speaker 62 to the microphone 210 of the remote controller 200, extraction of the ambient noise can be performed. In this manner, by performing a simple arithmetic operation based on the sound collected by the microphone 64, the sound pressure level of the ambient noise can be found.

In the first embodiment, assuming that ambient noise collected by the microphone 64 is approximately equal to that at the listening position of the user, the ambient noise is directly input to the loudness-compensation-gain calculating unit 30. However, since the acoustic characteristics C1 and C2 from the speaker 62 to the microphones 64 and 210 are determined by identifying operations, the accurate sound pressure level of ambient noise at the position of the microphone 210 may be calculated by using the acoustic characteristics C1 and C2, and may be input to the loudness-compensation-gain calculating unit 30.

Figure 12:
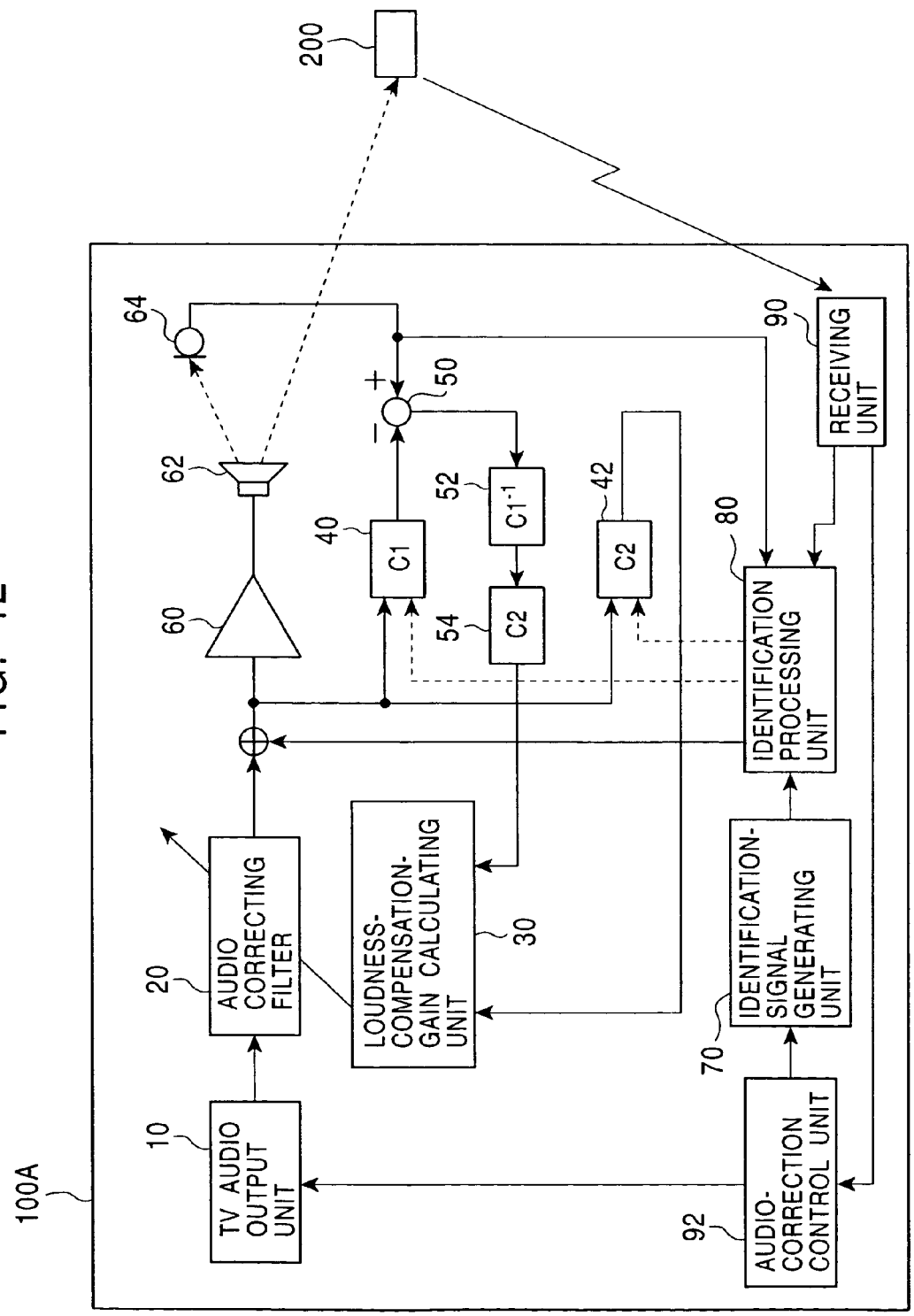
FIG. 12 is a block diagram showing a modification of a television apparatus which calculates an accurate sound pressure level of ambient noise.

FIG. 12 shows a television apparatus 100A which is a modification of the television apparatus 100 and which calculates an accurate sound pressure level of ambient noise. The television apparatus 100A differs from the television apparatus 100 in that acoustic characteristic setting units 52 and 54 are additionally provided between the arithmetic unit 50 and the loudness-compensation-gain calculating unit 30.

The acoustic characteristic setting unit 52 is an inverse filter in which an inverse characteristic C1-1 that is the reverse of acoustic characteristic C1 is set as an acoustic impulse response from the speaker 62 to the microphone 64 in the television apparatus 100, and converts ambient noise at the position of the microphone 64 which is output from the arithmetic unit 50 into ambient noise at the position of the speaker 62. The acoustic characteristic setting unit 54 is a filter in which acoustic characteristic C2 is set as an acoustic impulse response from the speaker 62 to the microphone 210 in the remote controller 200, and converts the ambient noise at the position of the speaker 62 into ambient noise at the position of the microphone 210.

As described above, by using the acoustic characteristic setting units 52 and 54, a broadcast-program audio signal and ambient noise signal at the listening position of the user can be input to the loudness-compensation-gain calculating unit 30, so that the sound pressure level of the broadcast-program audio signal can be closely corrected.

In the first embodiment, acoustic characteristic C1 as the acoustic impulse response from the speaker 62 to the microphone 64 in the television apparatus 100 is calculated by an identifying operation which is performed with predetermined timing. However, when the microphone 64 is provided in the housing of the television apparatus 100, acoustic characteristic C1 is a predetermined fixed value regardless of an environment (room space, etc.) in which the television apparatus 100 is provided. Accordingly, the acoustic characteristic C1 of the acoustic characteristic setting unit 40 may be set in production or in shipping. This can omit the adaptive filter 82 and arithmetic unit 86 included in the identification processing unit 80, so that the apparatus configuration and the processes can be simplified.

In the first embodiment, the identifying operation is started when the "Identify" key on the operation unit 214 in the remote controller 200 is pressed by the user. However, the start timing of the identifying operation may be determined as needed. For example, when the pressing of a "Power" key on the operation unit 214 by the user designates the supply of power to the television apparatus 100, the identifying operation may be started. When the user presses some operation keys (e.g., numeric keys for designating channel switching, up- and down-keys for designating a change in volume, etc.) on the operation unit 214, the identifying operation may be started. In such a case that the remote controller 200 is operated, it is clear that the user is close to the remote controller 200, and the position of the remote controller 200 can be used as the listening position.

Second Embodiment

Figure 13:
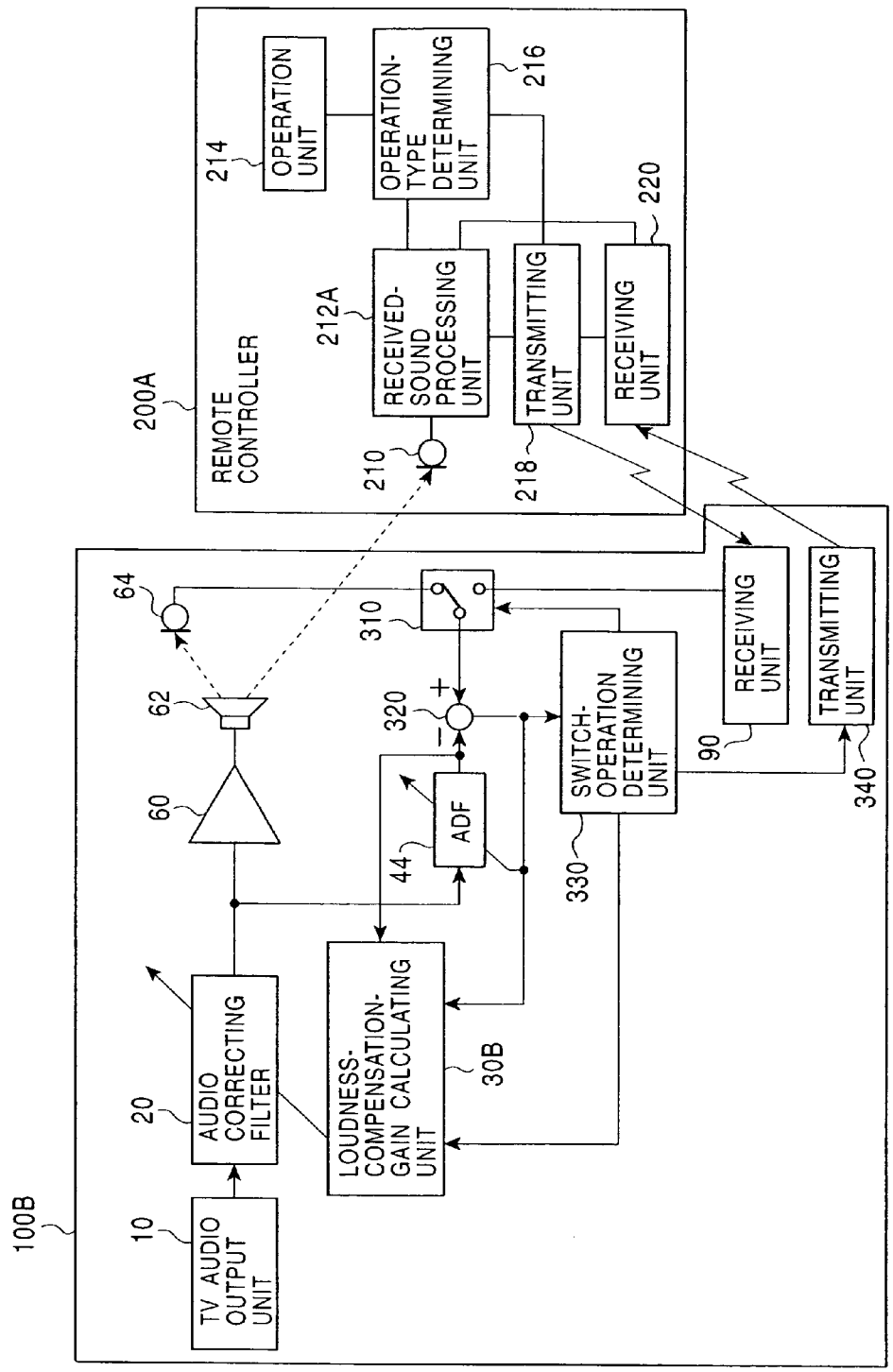
FIG. 13 is a block diagram showing the general configuration of a television set according to a second embodiment of the present invention.

FIG. 13 shows the general configuration of a television set according to a second embodiment of the present invention. As shown in FIG. 13, the television set according to the second embodiment includes a television apparatus 100B and a remote controller 200A. Similar to the television set according to the first embodiment, both are linked to each other by, for example, infrared communication.

The television apparatus 100B includes a television audio output unit 10, an audio-correcting filter 20, a loudness-compensation-gain calculating unit 30B, an adaptive filter (ADF) 44, an amplifier 60, a speaker 62, a microphone 64, a receiving unit 90, a selector switch 310, an arithmetic unit 320, a switch-selection determining unit 330, and a transmitting unit 340. The remote controller 200A includes a microphone 210, a received-sound processing unit 212A, an operation unit 214, an operation-type determining unit 216, a transmitting unit 218, and a receiving unit 220.

Functional units of the television apparatus 100B which basically perform operations identical to those of functional units of the television apparatus 100 in FIG. 1 are denoted by identical reference numerals. Accordingly, a detailed description thereof is omitted. Similarly, functional units of the remote controller 200A which basically perform operations identical to those of functional units of the remote controller 200 are denoted by identical reference numerals. Accordingly, a detailed description thereof is omitted.

The adaptive filter 44 identifies an acoustic characteristic C by measuring an acoustic impulse response from the speaker 62 to the remote controller 200A by using the broadcast-program audio signal output after passing from the television audio output unit 10 through the audio-correcting filter 20.

A sound signal input from the microphone 64 in the television apparatus 100B, and a sound signal received by the receiving unit 90 after being sent from the remote controller 200A are input to the selector switch 310. The selector switch 310 selectively inputs either signal to the arithmetic unit 320.

By subtracting an audio signal output from the adaptive filter 44 from the sound signal output from the selector switch 310, the arithmetic unit 320 outputs an error between both signals. When the broadcast-program audio signal is output from the audio-correcting filter 20, an audio signal which corresponds to the broadcast-program audio signal reaches the microphone 210 in the remote controller 200A after being output from the speaker 62. At the same time, a signal of sound actually collected by the microphone 210 is sent from the remote controller 200A to the receiving unit 90. This sound signal also includes noise collected by the microphone 210 other than the broadcast-program audio signal. Accordingly, switching of the selector switch 310 to the receiving unit 90 enables the arithmetic unit 320 to subtract only the broadcast-program audio signal output from the adaptive filter 44 from the combined broadcast-program sound and noise actually collected by the microphone 210, whereby only noise as the difference can be extracted. Alternatively, in the case of switching the selector switch 310 to the microphone 64, the broadcast-program sound at the position of the microphone 210 of the remote controller 200A is subtracted from the broadcast-program sound and noise collected by the microphone 64, so that the noise cannot be accurately extracted. However, the broadcast-program sound and noise collected by the microphone 64 are correlated with the broadcast-program sound and noise collected by the microphone 210 of the remote controller 200A. Thus, the above difference signal can be used to detect a change in noise.

The switch-selection determining unit 330 determines selecting timing of the selector switch 310 by monitoring the difference signal output from the arithmetic unit 320. Specifically, when the selector switch 310 is switched to the microphone 64, the difference signal output from the arithmetic unit 320 is captured, and when a change in noise level causes a change in the level of the difference signal to be not less than a predetermined value, the selector switch 310 is switched to the receiving unit 90 for a predetermined time. The time in which the selector switch 310 is switched to the receiving unit 90 is set to be equal to or longer than a time in which gain values calculated by the loudness-compensation-gain calculating unit 30B converge.

When the selector switch 310 is switched to the receiving unit 90 by the switch-selection determining unit 330, the loudness-compensation-gain calculating unit 30B sets the gain of the audio-correcting filter 20 based on the broadcast-program audio signal output from the adaptive filter 44 and the noise signal output from the arithmetic unit 320 so that the clearness of sound output from the speaker 62 is approximately constant when being heard by the user, regardless of the ambient noise. Also, when the selector switch 310 is switched to the microphone 64, a gain value calculated before the selector switch 310 is switched is retained. For example, the configuration shown in FIG. 7 or FIG. 8 can be used in unchanged form as the specific configuration of the loudness-compensation-gain calculating unit 30B. When a predetermined signal is input from the switch-selection determining unit 330 to the loudness-compensation-gain calculating unit 30B just before the selector switch 310 is switched to the microphone 64, the output value of the loudness calculating unit 34 in the loudness-compensation-gain calculating unit 30B is retained.

The transmitting unit 340 transmits an audio-signal-transmission ordering signal to the remote controller 200A when the selector switch 310 is switched to the receiving unit 90.

The receiving unit 220 in the remote controller 200A receives the audio-signal-transmission ordering signal transmitted from the transmitting unit 340 in the television apparatus 100B, and notifies the received-sound processing unit 212A of the reception of the audio-signal-transmission ordering signal. The received-sound processing unit 212A converts a sound signal output from the microphone 210 into a data format adapted for transmission. In the second embodiment, when the "Identify" key on the operation unit 214 is pressed, and when the receiving unit 220 receives the audio-signal-transmission ordering signal transmitted from the transmitting unit 340 in the television apparatus 100B, the conversion by the received-sound processing unit 212A is performed. Sound data obtained by the conversion is transmitted from the transmitting unit 218 to the receiving unit 90 in the television apparatus 100B.

The audio-correcting filter 20 and the loudness-compensation-gain calculating unit 30 correspond to an audio correcting unit. The arithmetic unit 50, the adaptive filter 44, and the switch-selection determining unit 330 correspond to a level-change detecting unit. Each of the transmitting units 218 and 340, and the receiving units 90 and 220 corresponds to a communication unit The television set according to the second embodiment of the present invention has the above-described configuration, and an operation thereof is described below.

When the television set operates normally, an operation of identifying an acoustic characteristic C for the adaptive filter 44 is performed. Its operation principle is basically identical to that performed by the identification processing unit 80 in the first embodiment of the present invention. In this identifying operation, an acoustic impulse response from the speaker 62 to the microphone 210 in the remote controller 200A is measured and the acoustic characteristic C is determined.

The broadcast-program audio signal output from the television audio output unit 10 is input to the amplifier 60 through the audio-correcting filter 20, and is output from the speaker 62. The microphone 64 provided on the television apparatus 100B collects ambient noise as well as the broadcast-program audio signal, and outputs, to the arithmetic unit 320, a sound signal obtained by combining the ambient noise and the audio signal. In addition to the sound signal input from the microphone 64 through the selector switch 310, a broadcast-program audio signal at the position of the microphone 210 in the remote controller 200A, which is output from the adaptive filter 44, is input to the arithmetic unit 320. The arithmetic unit 320 outputs a difference signal representing the difference between the signals. As described above, the level of the difference signal is proportional to the loudness of noise in the vicinity of the television apparatus 100B.

The switch-selection determining unit 330 monitors a level change in the difference signal output from the arithmetic unit 320. When the change exceeds a predetermined value, an audio-signal-transmission ordering signal is transmitted from the transmitting unit 340 to the remote controller 200A, and the selector switch 310 is switched to the receiving unit 90. In addition, the gain calculating operation by the loudness-compensation-gain calculating unit 30B is activated. After that, a sound signal corresponding to the sound (broadcast program sound and ambient noise) collected by the microphone 210 in the remote controller 200A is input to the arithmetic unit 320 through the receiving unit 90 and the selector switch 310. The arithmetic unit 320 outputs a noise signal obtained by subtracting the broadcast-program audio signal at the position of the microphone 210 in the remote controller 200A, which is output from the adaptive filter 44, from the above input signal.

Based on the noise signal output from the arithmetic unit 320 and the broadcast-program audio signal output from the adaptive filter 44, the loudness-compensation-gain calculating unit 30B sets the gain of the audio-correcting filter 20. As described above, the selector switch 310 is switched to the receiving unit 90 within a predetermined time after the noise level changes, whereby the gain setting operation by the loudness-compensation-gain calculating unit 30B is performed based on sound actually collected by the microphone 210, and, after the predetermined time elapses, the selector switch 310 is switched to the microphone 64, and the gain value set by the loudness-compensation-gain calculating unit 30B is retained. This operation is repeatedly performed whenever the noise level changes.

As described above, by using the microphone 210 provided on the remote controller 200A to identify an acoustic characteristic C from the television apparatus 100B to the microphone 210, and using the adaptive filter 44, in which the identified acoustic characteristic C is set, the sound pressure level of sound output from the speaker 62 provided on the television apparatus 100B, at the time the sound reaches the listening position, can be known. Also, when the sound pressure level of ambient noise changes, by using sound actually collected by the microphone 210 provided on the remote controller 200A, the accurate sound pressure level of the ambient noise can be known. By correcting the sound pressure level of the sound which reaches the listening position based on the accurate sound pressure level of the ambient noise, the output sound can be clearly heard, even if ambient noise is generated.

The present invention is not limited to the above embodiments, but may be variously modified within the scope of the present invention. Although each of the above embodiments uses the microphone 210 provided on the remote controller 200 or 200A, the microphone 210 may be provided on another operation device which can be operated by the user. For example, a cellular phone or the like, which does not have a direct relationship with the operation of the television apparatus 100, may include the microphone 210 and a function of transmitting a sound signal. Also, in this case, radio communication, etc., other than infrared radiation, may be employed as the means of communication. This similarly applies to the remote controller 200.

Although the above embodiments have described the case of applying the present invention to a television set, the present invention may be applied to apparatuses having audio output functions, such as audio apparatuses and receivers.

It is therefore intended that the foregoing detailed description be regarded as illustrative rather than limiting, and that it be understood that it is the following claims, including all equivalents, that are intended to define the spirit and scope of this invention.

The invention claimed is:

1. An audio correcting apparatus comprising:
a speaker provided on an apparatus;
a first microphone provided on an operation device operated by a user;
an identifying unit which identifies a first acoustic characteristic from said speaker to said first microphone;
a first filter which has the first acoustic characteristic identified by said identifying unit;
a second microphone provided on said apparatus;
a second filter having a second acoustic characteristic from said speaker to said second microphone;
an ambient noise extracting unit which extracts ambient noise from sound collected by said second microphone, wherein the ambient noise is extracted by subtracting a signal obtained by allowing an audio signal input to said speaker to pass through said second filter from a signal representing the sound collected by said second microphone;

an identification-signal generating unit which generates an identification signal for use in identifying the first acoustic characteristic and the second acoustic characteristic by said identifying unit, wherein, when the identification signal is output by said identification-signal generating unit, said identifying unit captures and uses sound collected by said first microphone to identify the first acoustic characteristic, while said identifying unit captures and uses the sound collected by said second microphone to identify the second acoustic characteristic; and an audio correcting unit which, based on two input signals, one signal being obtained by allowing the audio signal input to said speaker to pass through said first filter and the other signal representing ambient noise, corrects the sound pressure level of sound output from said speaker so that the sound output from said speaker is clearly heard when reaching the user without being substantially affected by the ambient noise.

2. An audio correcting apparatus according to claim 1, further comprising a communication unit by which said operation device and said apparatus are linked in communication to each other without using a connecting line.

3. An audio correcting apparatus according to claim 1, wherein said operation device is a remote controller for instructing said apparatus to perform an operation.

4. An audio correcting apparatus according to claim 1, wherein said apparatus is a television apparatus.

5. An audio correcting apparatus according to claim 1, wherein the identification signal is a white noise signal.

6. An audio correcting apparatus according to claim 1, wherein:

said speaker is provided at a predetermined position on the housing of said apparatus; and instead of using a result obtained by an identifying operation of said identifying unit, a fixed value based on the result of a predetermined measurement is used as the second acoustic characteristic.

7. An audio correcting apparatus comprising:
a speaker provided on an apparatus;
a first microphone provided on an operation device operated by a user;
an identifying unit which identifies a first acoustic characteristic from said speaker to said first microphone;
a first filter which has the first acoustic characteristic identified by said identifying unit;
a second microphone provided on said apparatus;
a second filter having a second acoustic characteristic from said speaker to said second microphone;
a third filter having an inverse characteristic which is the inverse of the second acoustic characteristic;
an ambient noise extracting unit which extracts ambient noise from sound collected by said second microphone, wherein said ambient noise extracting unit extracts the ambient noise by calculating a signal which is obtained by subtracting the signal obtained by allowing an audio signal input to said speaker to pass through said second filter from the signal representing the sound collected by said second microphone, and allowing the calculated signal to pass through said third filter and said first filter; and an audio correcting unit which, based on two input signals, one signal being obtained by allowing the audio signal input to said speaker to pass through said first filter and the other signal representing ambient noise, corrects the sound pressure level of sound output from said speaker so that the sound output from said speaker is clearly heard when reaching the user without being substantially affected by the ambient noise.

8. An audio correcting apparatus according to claim 7, wherein:

the inverse characteristic is calculated based on the second acoustic characteristic; and, by allowing the calculated signal to pass through said third filter, the sound output from said speaker is calculated based on sound reaching the position of said second microphone.

9. An audio correcting apparatus comprising:
a speaker provided on an apparatus;
a first microphone provided on an operation device operated by a user;
an identifying unit which identifies a first acoustic characteristic from said speaker to said first microphone;
a first filter having the first acoustic characteristic identified by said identifying unit;
a second microphone provided on said apparatus;
a second filter having a second acoustic characteristic from said speaker to said second microphone;
an ambient noise extracting unit which extracts ambient noise from sound collected by said second microphone, wherein the ambient noise is extracted by subtracting a signal obtained by allowing an audio signal input to said speaker to pass through said second filter from a signal representing the sound collected by said second microphone;

an identification-signal generating unit which generates an identification signal for use in identifying the first acoustic characteristic and the second acoustic characteristic by said identifying unit, wherein, when the identification signal is output by said identification-signal generating unit, said identifying unit captures and uses sound collected by said first microphone to identify the first acoustic characteristic, while said identifying unit captures and uses the sound collected by said second microphone to identify the second acoustic characteristic;

a level-change detecting unit which detects a level change in ambient noise based on sound collected by said second microphone; and an audio correcting unit which, when the level change in ambient noise is detected by said level-change detecting unit, based on two signals, one signal being obtained by allowing an audio signal input to said speaker to pass through said first filter and the other signal representing the ambient noise, corrects the sound pressure level of sound output from said speaker so that the sound output from said speaker is clearly heard when reaching the user.

10. An audio correcting apparatus according to claim 9, wherein said audio correcting unit corrects the sound pressure level for each of a plurality of divided frequency bands.

11. An audio correcting apparatus according to claim 10, wherein:

said audio correcting unit includes gain tables which correspond to the divided frequency bands, and in each of which, when the sound pressure level of the ambient noise and a desired sound pressure level in terms of auditory sense of the sound output from said speaker are designated, a correcting gain corresponding to the designated levels is found; and said audio correcting unit corrects the sound pressure level by referring to the gain tables.

12. An audio correcting apparatus according to claim 11, wherein:
- said operating device includes an operation unit for instructing said apparatus to perform an operation; and
- said identifying unit performs an identifying operation when said operation unit instructs said apparatus to perform the operation.

13. An audio correcting apparatus according to claim 9, wherein:
- said operation device includes an operation unit for the user to instruct an audio correcting operation to be executed; and
- said audio correcting unit performs the audio correcting operation when said operation unit is used by the user to instruct the audio correcting operation to be executed.

14. An audio correcting apparatus according to claim 9, wherein:
- said operation device includes an operation unit for instructing the power of said apparatus to be turned on; and
- said audio correcting unit performs an identifying operation when the power of said apparatus is instructed by said operation unit to be turned on.

15. An audio correcting method for an audio correcting apparatus comprising a speaker provided on an apparatus; a first microphone provided on an operation device operated by a user; an identifying unit which identifies a first acoustic characteristic from said speaker to said first microphone; a first filter having the first acoustic characteristic from said speaker to said first microphone; a second microphone provided on said apparatus; a second filter having a second acoustic characteristic from said speaker to said second microphone; a third filter having an inverse characteristic which is the inverse of the second acoustic characteristic; and an ambient noise extracting unit which extracts ambient noise from sound collected by said second microphone, wherein said ambient noise extracting unit extracts the ambient noise by calculating a signal which is obtained by subtracting the signal obtained by allowing an audio signal input to said speaker to pass through said second filter from the signal representing the sound collected by said second microphone, and allowing the calculated signal to pass through said third filter and said first filter; and wherein said audio correcting method comprises:
- detecting a level change in ambient noise based on sound collected by said second microphone; and,
- when the level change in ambient noise is detected, based on two signals, one signal being obtained by allowing an audio signal input to said speaker to pass through said first filter and the other signal representing the ambient noise, correcting the sound pressure level of sound output from said speaker so that the sound output from said speaker is clearly heard when reaching the user without being substantially affected by the ambient noise.

16. An audio correcting method according to claim 15, wherein the act of correcting the sound pressure level of the sound comprises an act of correcting the sound pressure level of the sound for each of a plurality of divided frequency bands.

17. An audio correcting method according to claim 16, wherein:
- said audio correcting apparatus includes gain tables which correspond to the divided frequency bands, and in each of which, when the sound pressure level of the ambient noise and a desired sound pressure level in terms of auditory sense of the sound output from said speaker are designated, a correcting gain corresponding to the designated levels is found; and
- the act of correcting the sound pressure level of the sound comprises an act of correcting the sound pressure level of the sound by referring to the gain tables.

* * * * *